(12) United States Patent
Wang et al.

(10) Patent No.: US 8,492,835 B1
(45) Date of Patent: Jul. 23, 2013

(54) HIGH VOLTAGE MOSFET DEVICE

(75) Inventors: Chih-Chung Wang, Hsinchu (TW);
Ming-Tsung Lee, Yilan County (TW);
Chung-I Huang, Tainan (TW);
Shan-Shi Huang, Hsinchu (TW);
Wen-Fang Lee, Hsinchu (TW); Te-Yuan Wu, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/354,439

(22) Filed: Jan. 20, 2012

(51) Int. Cl.
*H01L 29/76* (2006.01)
*H01L 29/94* (2006.01)

(52) U.S. Cl.
USPC ............................ 257/339; 257/345; 438/282

(58) Field of Classification Search
USPC .... 257/339, 345, E21.632, E21.642; 438/282
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |

(Continued)

OTHER PUBLICATIONS

U.S. Appl. No. 13/216,276, filed Aug. 24, 2011.

(Continued)

*Primary Examiner* — Theresa T Doan
(74) *Attorney, Agent, or Firm* — WPAT, PC; Justin King

(57) ABSTRACT

A HV MOSFET device includes a substrate, a deep well region, a source/body region, a drain region, a gate structure, and a first doped region. The deep well region includes a boundary site and a middle site. The source/body region is formed in the deep well region and defines a channel region. The first doped region is formed in the deep well region and disposed under the gate structure, and having the first conductivity type. There is a first ratio between a dopant dose of the first doped region and a dopant dose of the boundary site of the deep well region. There is a second ratio between a dopant dose of the first doped region and a dopant dose of the middle site of the deep well region. A percentage difference between the first ratio and the second ratio is smaller than or equal to 5%.

9 Claims, 4 Drawing Sheets

U.S. PATENT DOCUMENTS

| | | |
|---|---|---|
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,750,524 B2 | 6/2004 | Parthasarthy et al. |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,873,011 B1 * | 3/2005 | Huang et al. .................. 257/345 |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,368,785 B2 | 5/2008 | Chen et al. |
| 7,427,552 B2 | 9/2008 | Jin |
| 7,449,748 B2 | 11/2008 | Kao et al. |
| 7,485,523 B2 | 2/2009 | Chen |
| 7,531,888 B2 | 5/2009 | Cai |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0240628 A1 | 10/2006 | Chen |
| 2006/0261407 A1 | 11/2006 | Blanchard |
| 2006/0270134 A1 | 11/2006 | Lee |
| 2006/0270171 A1 | 11/2006 | Chen et al. |
| 2007/0041227 A1 | 2/2007 | Hall |
| 2007/0082440 A1 | 4/2007 | Shiratake |
| 2007/0132033 A1 | 6/2007 | Wu |
| 2007/0170539 A1 | 7/2007 | Kao et al. |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0078721 A1 * | 4/2010 | Fujii ............................ 257/344 |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |

OTHER PUBLICATIONS

Zia Hossain, "Determination of Manufacturing Resurf Process Window for a Robust 700V Double Resurf LDMOS Transistor", Proceedings of the 20th International Symposium on Power Semiconductor Devices & IC's, May 18-22, 2008 Oralando, FL.

\* cited by examiner

HIGH VOLTAGE MOSFET DEVICE

FIELD OF THE INVENTION

The present invention relates to a high voltage MOSFET device, and more particularly to a high voltage MOSFET device with an enhanced breakdown voltage.

BACKGROUND OF THE INVENTION

Conventionally, a high voltage metal-oxide-semiconductor field-effect transistor (HV MOSFET) device has a circular configuration. From the top view of the circular HV MOSFET device, the central portion is the drain region, and the outer portion enclosing the drain region is the source region. In addition, the width of the channel region of the circular HV MOSFET device is determined according to the circumference of the intermediate zone between the drain region and the source region. A conventional approach of increasing the conduction current of the HV MOSFET device is to increase the radius of the HV MOSFET device. However, the increase of the radius of the HV MOSFET device will increase the area of the HV MOSFET device.

For increasing the conduction current of the HV MOSFET device while minimizing the area of the HV MOSFET device, a race-track HV MOSFET device and an M-type HV MOSFET device have been disclosed. By contrast, the use of the M-type HV MOSFET device can achieve a higher conduction current.

By the conventional manufacturing processes, the breakdown voltage (BDV) of the M-type HV MOSFET device is lower than each of the breakdown voltage of the circular HV MOSFET device and the breakdown voltage of the race-track HV MOSFET device. For simultaneously forming the three types of HV MOSFET devices on the same integrated circuit, the voltage-withstanding capability of the overall integrated circuit is deteriorated because of the limitation of the breakdown voltage of the M-type HV MOSFET device.

The present inventors found that the conventional M-type HV MOSFET device has so many round corners. Due to the round corners, the M-type HV MOSFET device has higher electric field and higher electric current in some specified sites. Under this circumstance, the voltage-withstanding capability of these specified sites will be impaired, and thus the breakdown voltage of the overall M-type HV MOSFET device is deteriorated. For solving the above drawbacks, a high voltage MOS transistor and fabricating method thereof are disclosed in a co-pending U.S. patent application Ser. No. 13/216,276, which was filed by the same assignee of the present application. However, the performance is still unsatisfied.

Therefore, there is a need of providing an improved HV MOSFET device for increasing the breakdown voltage in order to integrate various shapes of HV MOSFET devices.

SUMMARY OF THE INVENTION

In accordance with an aspect, the present invention provides a HV MOSFET device. The HV MOSFET device includes a substrate, a deep well region, a source/body region, a drain region, a gate structure, and a first doped region. The substrate has a first conductivity type. The deep well region is constructed in the substrate, and has a second conductivity type different from the first conductivity type. The deep well region includes a boundary site and a middle site. The boundary site is located around the middle site. The source/body region is formed in the deep well region and defines a channel region. The drain region is formed in the deep well region. The gate structure is arranged between the source/body region and the drain region, wherein the gate structure comprises an insulator layer. The first doped region is formed in the deep well region and disposed under the insulator layer, and having the first conductivity type. There is a first ratio between a dopant dose of the first doped region and a dopant dose of the boundary site of the deep well region. There is a second ratio between a dopant dose of the first doped region and a dopant dose of the middle site of the deep well region. A percentage difference between the first ratio and the second ratio is smaller than or equal to 5%.

In an embodiment, the substrate is a silicon substrate.

In an embodiment, the source/body region includes a high voltage well region, a body contact region, and a source contact region. The high voltage well region is formed in the deep well region, and has the first conductivity type. The body contact region is formed in the high voltage well region, and has the first conductivity type, wherein the source contact region has a higher dopant dose than the high voltage well region. The source contact region is formed in the high voltage well region, and has the second conductivity type.

In an embodiment, the drain region includes a drift region and a drain contact region. The drift region is formed in the deep well region, and has the second conductivity type. The drain contact region is formed in the drift region, and has the second conductivity type, wherein the drain contact region has a higher dopant dose than the drift region.

In an embodiment, the gate structure further includes a gate dielectric layer, a gate conductor layer, and a field electrode. The gate dielectric layer is disposed over the channel region. The gate conductor layer is formed on the gate dielectric layer. The field electrode is formed on the insulator layer.

In an embodiment, the first doped layer is a top layer.

In an embodiment, the HV MOSFET device is an M-type HV MOSFET device.

In an embodiment, the first conductivity type is a P type, and the second conductivity type is an N type.

In an embodiment, the first conductivity type is an N type, and the second conductivity type is a P type.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
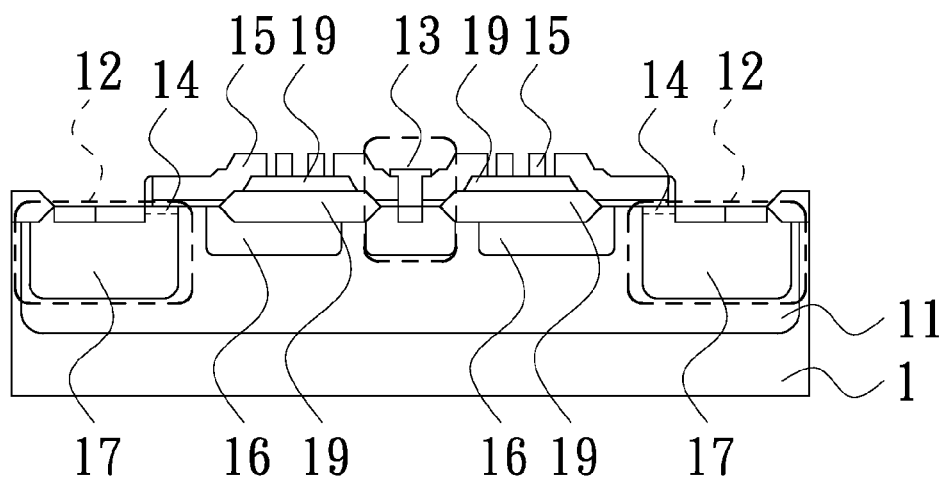
FIG. 1 is a schematic cross-sectional view illustrating a HV MOSFET device.

The present invention will now be described more specifically with reference to the following embodiments. It is to be noted that the following descriptions of preferred embodi- FIG. 1 is a schematic cross-sectional view illustrating a HV MOSFET device. The HV MOSFET device comprises a substrate 1, a deep well region 11, a source/body region 12, a drain region 13, a gate structure 15, and a first doped region 16. The substrate 1 has a first conductivity type. The deep well region 11 is constructed in the substrate 1. The deep well region 11 has a second conductivity type, wherein the second conductivity type is different from the first conductivity type. The source/body region 12 and the drain region 13 are both formed in the deep well region 11. In addition, a high voltage well region 17 is formed in the source/body region 12, wherein the high voltage well region 17 has the first conductivity type. The channel region 14 is defined within the high voltage well region 17. The gate structure 15 is disposed over the channel region 14. An insulator layer 19 is formed between the channel 14 and the drain region 13. For example, the insulator layer 19 is a field oxide layer. The first doped region 16 is formed in the deep well region 11 and disposed under the field oxide layer 19. The first doped region 16 has the first conductivity type. In the following embodiments, the first conductivity type is a P type, and the second conductivity type is an N type. In practical applications, the first conductivity type may be an N type, and the second conductivity type may be a P type.

Figure 2:
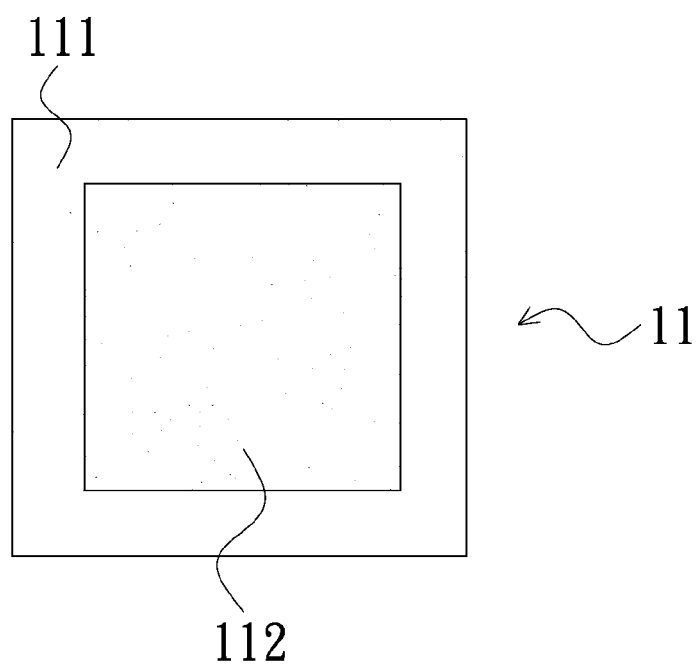
FIG. 2 is a schematic top view illustrating the dopant distribution of the deep well region of an M-type HV MOSFET device after the M-type HV MOSFET device is subject to a high-temperature thermal process for a long time period.

The present inventors found that some phenomena occur after the M-type HV MOSFET device is subject to a high-temperature thermal process for a long time period. For example, during the thermal process, the high temperature may result in a thermal diffusion effect. Due to the thermal diffusion effect, the dopant distribution in the M-type HV MOSFET device is changed. Consequently, a ratio between the P-type dopant dose of the first doped region 16 (i.e. a P-top layer) and the N-type dopant dose of the deep well region 11 becomes non-uniform. Under this circumstance, since the ratio between the P-type dopant dose of the first doped region 16 and the N-type dopant dose of the deep well region 11 in some specified sites is far away from an optimized ratio, the degradation of the breakdown voltage is induced. FIG. 2 is a schematic top view illustrating the dopant distribution of the deep well region of an M-type HV MOSFET device after the M-type HV MOSFET device is subject to a high-temperature thermal process for a long time period. As shown in FIG. 2, the N-type dopant in the boundary site 111 of the deep well region 11 is readily diffused outwardly, so that the N-type dopant dose of the boundary site 111 of the deep well region 11 is largely reduced. Under this circumstance, the N-type dopant dose of the boundary site 111 of the deep well region 11 and the N-type dopant dose of the middle site 112 are not uniform. Please refer to FIG. 2 again. Originally, the N-type dopant of the deep well region 11 is uniformly distributed. After the M-type HV MOSFET device is subject to a high-temperature thermal process for a long time period, the N-type dopant dose of the boundary site 111 of the deep well region 11 is lower than the N-type dopant dose of the middle site 112.

Figure 3A:
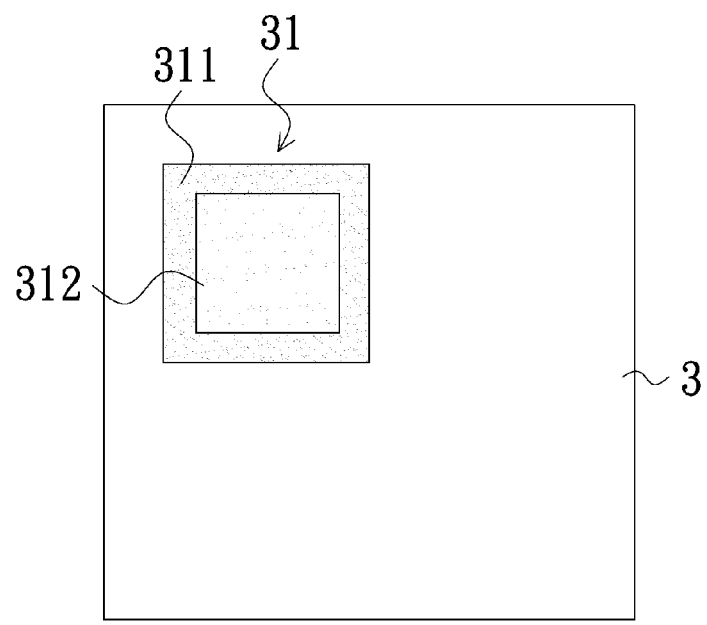
FIGS. 3A-3C schematically illustrate a method for fabricating a HV MOSFET device according to an embodiment of the present invention.
Figure 3B:
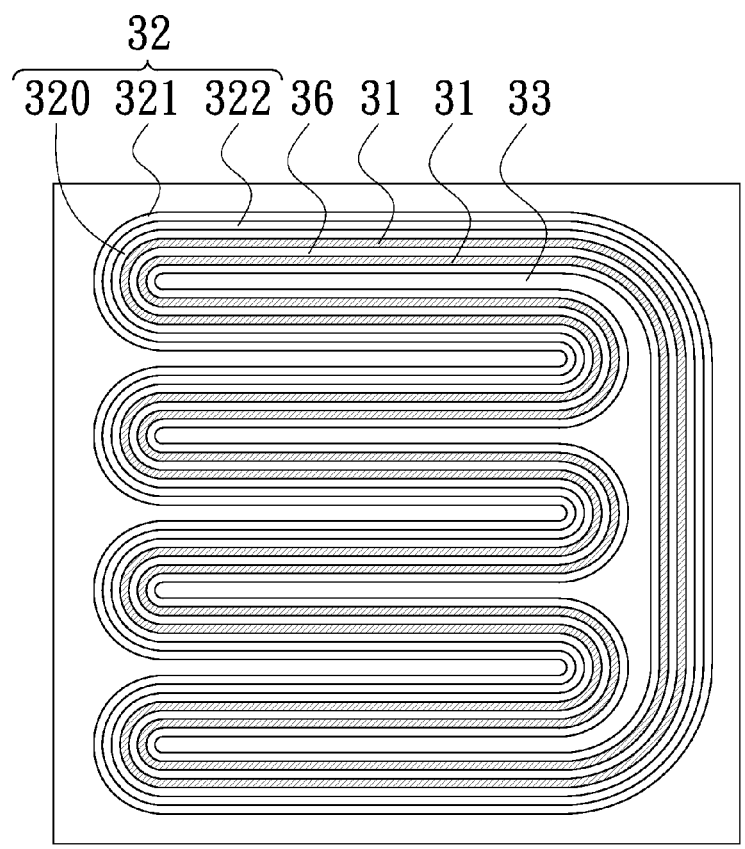
Figure 3C:
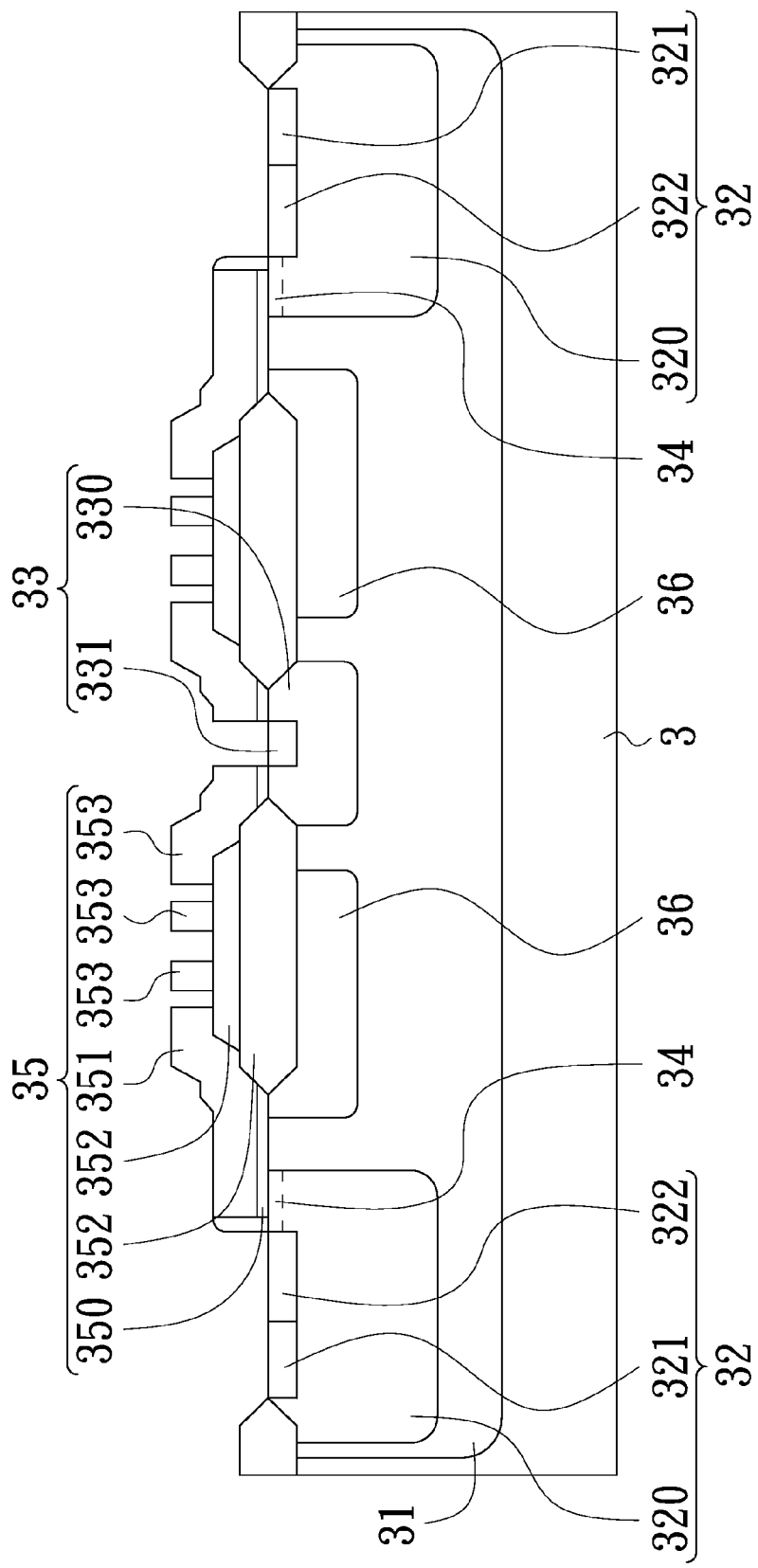

For solving the above drawbacks, the present invention provides a method for fabricating a HV MOSFET device. FIGS. 3A-3C schematically illustrate a method for fabricating a HV MOSFET device according to an embodiment of the present invention. Firstly, as shown in FIG. 3A, a P-type substrate 3 is provided. An N-type deep well region 31 is constructed in the P-type substrate 3. In addition, after an ion implantation process is performed, the N-type dopant dose of the boundary site 311 of the N-type deep well region 31 and the N-type dopant dose of the middle site 312 are controlled to be different. In this embodiment, the N-type dopant dose of the boundary site 311 is controlled to be higher than the N-type dopant dose of the middle site 312.

Then, as shown in FIG. 3B, a source/body region 32, a drain region 33 and a first doped region 36 are formed in the N-type deep well region 31.

Then, a gate structure 35 and other components are formed. The resulting structure of the HV MOSFET device is shown in the cross-sectional view of FIG. 3C. The P-type substrate 3 is a P-type substrate. The source/body region 32 comprises a high voltage P-well region 320, a P+ body contact region 321 (i.e. a heavily P-doped region), and an N+ source contact region 322, wherein the dopant dose of the source contact region 321 is higher than the dopant dose of the high voltage P-well region 320. The drain region 33 comprises an N-drift region 330 and an N+ drain contact region 331 (i.e. a heavily N-doped region), wherein the dopant dose of the drain contact region 331 is higher than the dopant dose of the N-drift region 330. The gate structure 35 comprises a gate dielectric layer 350, a gate conductor layer 351, an insulator layer 352, and a field electrode 353. The gate dielectric layer 350 and the insulator layer 352 are disposed over the channel region 34, the N-type deep well region 31 and the first doped region 36. The gate conductor layer 351 and the field electrode 353 are disposed on the gate dielectric layer 350 and the insulator layer 352.

From the above discussions, the N-type dopant dose of the boundary site 311 of the N-type deep well region 31 is controlled to be higher than the N-type dopant dose of the middle site 312 after the ion implantation process is performed. Even if the thermal diffusion effect occurs after the high-temperature thermal process is carried out for a long time period, the N-type dopant in the boundary site 311 of the deep well region 31 is still diffused outwardly. Consequently, the N-type dopant dose of the boundary site 311 of the N-type deep well region 31 is reduced to be substantially equal to the N-type dopant dose of the middle site 312. Preferably, after the high-temperature thermal process is carried out for a long time period, there is a first ratio between the P-type dopant dose of the first doped region 36 and the N-type dopant dose of the boundary site 311 of the deep well region 31, and there is a second ratio between the P-type dopant dose of the first doped region 36 and the N-type dopant dose of the middle site 312 of the deep well region 31. Preferably, a percentage difference between the first ratio and the second ratio is smaller than or equal to 5%. In such way, the breakdown voltage is increased, and the drawbacks encountered from the prior art are eliminated. Moreover, in a case that the concepts disclosed in the a co-pending U.S. patent application Ser. No. 13/216,276 are be applied to the present invention, the performance of the HV MOSFET device will be further enhanced.

The present invention provides several approaches for controlling the N-type dopant dose of the boundary site 311 of the deep well region 31 to be higher than the N-type dopant dose of the middle site 312. In accordance with a first approach, two implantation masks are employed to implant the N-type dopant. A first implantation process is performed to introduce the N-type dopant through the opening of the first implantation mask, thereby defining the deep well region 31. Then, the boundary site 311 of the deep well region 31 is exposed to the opening of the second implantation mask. Then, a second implantation process is performed to introduce the N-type dopant through the opening of the second implantation mask.

Under this circumstance, the N-type dopant dose of the boundary site 311 is higher than the N-type dopant dose of the middle site 312.

Figure 4:
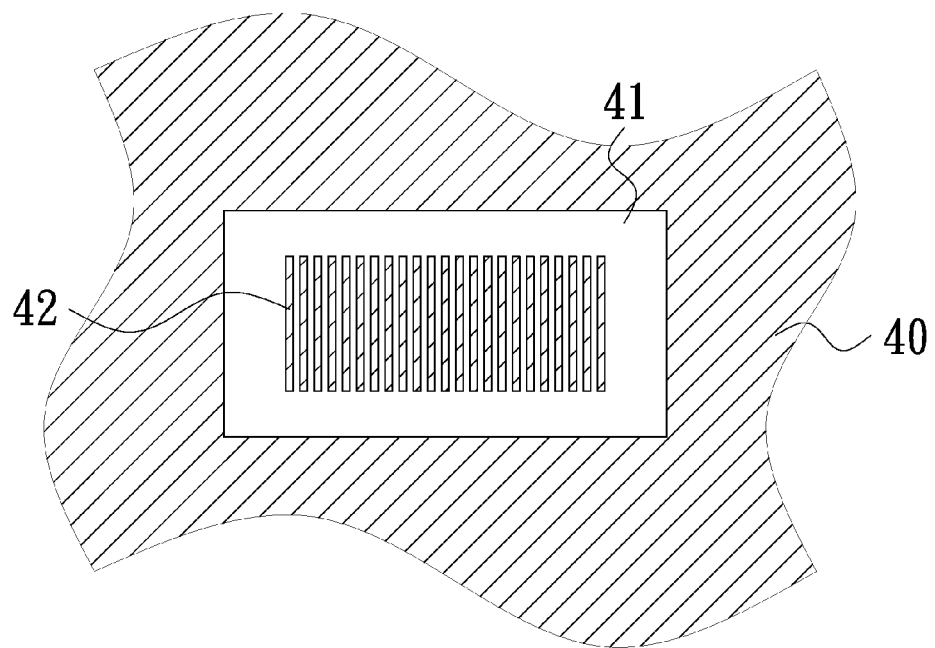
FIG. 4 schematically illustrates an exemplary implantation mask used in the present invention.

In accordance with a second approach, a special implantation mask 40 as shown in FIG. 4 is provided. The boundary site 311 is completely exposed to the opening 41 of the implantation mask 40, but the implantation mask 40 has a plurality of elongated bars 42 corresponding to the middle site 312. After a single implantation process is performed, the middle site 312 is only partially doped with the N-type dopant. Under this circumstance, the N-type dopant dose of the boundary site 311 is higher than the N-type dopant dose of the middle site 312.

In accordance with a third approach, a gradient mask (not shown) is provided. The dot density of the gradient mask corresponding to the boundary site 311 is lower than the dot density of the gradient mask corresponding to the middle site 312. After a single implantation process is performed to introduce the N-type dopant through the vacant space of the gradient mask, the N-type dopant dose of the boundary site 311 is higher than the N-type dopant dose of the middle site 312.

As mentioned above, there is a first ratio between the P-type dopant dose of the first doped region 36 and the N-type dopant dose of the boundary site 311 of the deep well region 31, and there is a second ratio between the P-type dopant dose of the first doped region 36 and the N-type dopant dose of the middle site 312 of the deep well region 31.

The present invention provides several approaches for adjusting the percentage difference between the first ratio and the second ratio to be smaller than or equal to 5%. By these approaches, the P-type dopant dose of the first doped region 36 is adjusted while the N-type dopant dose of the boundary site 311 of the deep well region 31 is kept unchanged. That is, the P-type dopant dose of the first doped region 36 corresponding to the boundary site 311 is decreased, but the P-type dopant dose of the first doped region 36 corresponding to the middle site 312 is increased.

In accordance with a first approach, two implantation masks are employed to implant the P-type dopant. A first implantation process is performed to introduce the P-type dopant through the opening of the first implantation mask, thereby defining the first doped region 36. Then, the first doped region 36 corresponding to the middle site 312 of the deep well region 31 is exposed to the opening of the second implantation mask. Then, a second implantation process is performed to introduce the P-type dopant through the opening of the second implantation mask. Under this circumstance, the P-type dopant dose of the first doped region 36 corresponding to the middle site 312 is higher than the P-type dopant dose of the first doped region 36 corresponding to the boundary site 311.

Figure 5:
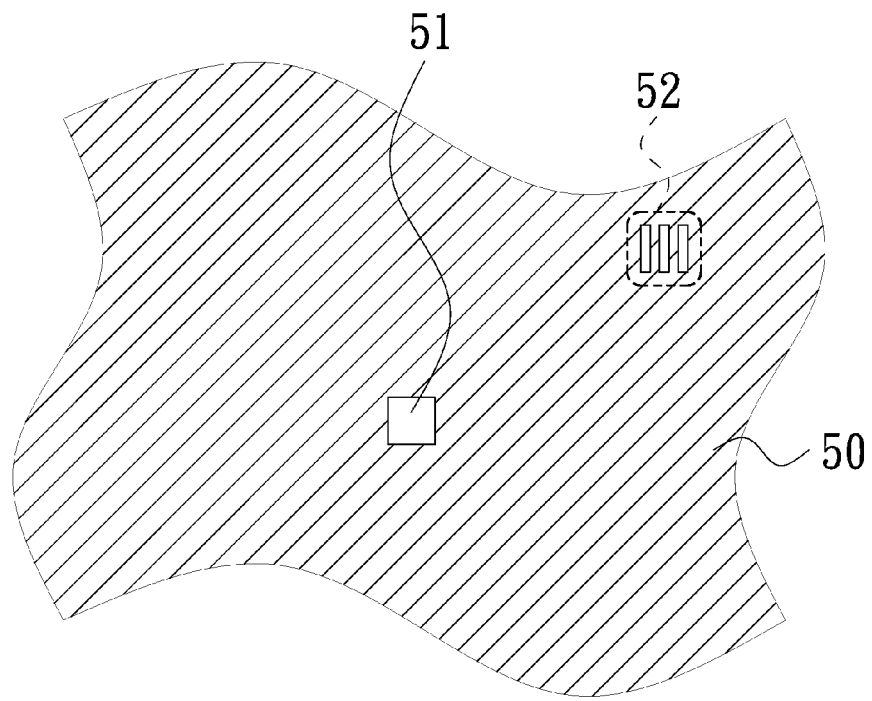
FIG. 5 schematically illustrates another exemplary implantation mask used in the present invention.

In accordance with a second approach, a special implantation mask 50 as shown in FIG. 5 is provided. The first doped region 36 corresponding to the middle site 312 is completely exposed to the opening 51 of the implantation mask 50, but the first doped region 36 corresponding to the boundary site 311 is exposed to a grid-shaped opening 52 of the implantation mask 50. After a single implantation process is performed, the first doped region 36 corresponding to the boundary site 311 is only partially doped with the P-type dopant. Under this circumstance, the N-type dopant dose of the boundary site 311 is higher than the N-type dopant dose of the middle site 312. Under this circumstance, the P-type dopant dose of the first doped region 36 corresponding to the middle site 312 is higher than the P-type dopant dose of the first doped region 36 corresponding to the boundary site 311.

In accordance with a third approach, a gradient mask (not shown) is provided. The dot density of the gradient mask corresponding to the middle site 312 is lower than the dot density of the gradient mask corresponding to the boundary site 311. After a single implantation process is performed to introduce the P-type dopant through the vacant space of the gradient mask, the P-type dopant dose of the first doped region 36 corresponding to the middle site 312 is higher than the P-type dopant dose of the first doped region 36 corresponding to the boundary site 311.

As mentioned above, the N-type dopant in the boundary site 311 of the deep well region 31 is readily diffused outwardly after the high-temperature thermal process is carried out for a long time period. Whereas, the P-type dopant dose of the first doped region 36 is not easily diffused after the high-temperature thermal process is carried out for a long time period. Due to the thermal diffusion effect, the N-type dopant dose of the boundary site 311 of the N-type deep well region 31 is reduced. Consequently, the lower N-type dopant dose of the boundary site 311 can match the lower P-type dopant dose of the first doped region 36 corresponding to the boundary site 311. In such way, the percentage difference between the first ratio and the second ratio is adjusted to be smaller than or equal to 5%.

From the above description, the percentage difference between the first ratio and the second ratio is reduced by adjusting the dopant dose. Consequently, the breakdown voltage degradation problem of the conventional M-type HV MOSFET device will be minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A HV MOSFET device, comprising:
a substrate having a first conductivity type;
a deep well region constructed in the substrate, and having a second conductivity type different from the first conductivity type, wherein the deep well region comprises a boundary site and a middle site, wherein the boundary site is located around the middle site;
a source/body region formed in the deep well region and defining a channel region;
a drain region formed in the deep well region;
a gate structure arranged between the source/body region and the drain region, wherein the gate structure comprises an insulator layer; and
a first doped region formed in the deep well region and disposed under the insulator layer, and having the first conductivity type, wherein there is a first ratio between a dopant dose of the first doped region and a dopant dose of the boundary site of the deep well region, and there is a second ratio between a dopant dose of the first doped region and a dopant dose of the middle site of the deep well region, wherein a percentage difference between the first ratio and the second ratio is smaller than or equal to 5%.

2. The HV MOSFET device according to claim 1, wherein the substrate is a silicon substrate.

3. The HV MOSFET device according to claim 1, wherein the source/body region comprises:

a high voltage well region formed in the deep well region, and having the first conductivity type;

a body contact region formed in the high voltage well region, and having the first conductivity type, wherein the source body contact region has a higher dopant dose than the high voltage well region; and a source contact region formed in the high voltage well region, and having the second conductivity type.

4. The HV MOSFET device according to claim 1, wherein the drain region comprises:

a drift region formed in the deep well region, and having the second conductivity type; and a drain contact region formed in the drift region, and having the second conductivity type, wherein the drain contact region has a higher dopant dose than the drift region.

5. The HV MOSFET device according to claim 1, wherein the gate structure further comprises:

a gate dielectric layer disposed over the channel region;

a gate conductor layer disposed on the gate dielectric layer; and a field electrode disposed on the insulator layer.

6. The HV MOSFET device according to claim 1, wherein the first doped layer is a top layer.

7. The HV MOSFET device according to claim 1, wherein the HV MOSFET device is an M-type HV MOSFET device.

8. The HV MOSFET device according to claim 1, wherein the first conductivity type is a P type, and the second conductivity type is an N type.

9. The HV MOSFET device according to claim 1, wherein the first conductivity type is an N type, and the second conductivity type is a P type.

* * * * *